United States Patent
Okada

(10) Patent No.: US 12,537,506 B2
(45) Date of Patent: Jan. 27, 2026

(54) ACOUSTIC WAVE DEVICE

(71) Applicant: Murata Manufacturing Co., Ltd., Nagaokakyo (JP)

(72) Inventor: Keiji Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 763 days.

(21) Appl. No.: 17/972,599

(22) Filed: Oct. 25, 2022

(65) Prior Publication Data
US 2023/0134299 A1 May 4, 2023

(30) Foreign Application Priority Data

Nov. 2, 2021 (JP) ................................. 2021-179336

(51) Int. Cl.
*H03H 9/205* (2006.01)
*H03H 9/05* (2006.01)
(Continued)

(52) U.S. Cl.
CPC .......... *H03H 9/205* (2013.01); *H03H 9/0523* (2013.01); *H03H 9/0566* (2013.01);
(Continued)

(58) Field of Classification Search
CPC .... H03H 9/205; H03H 9/0523; H03H 9/0566; H03H 9/1042; H03H 9/125; H03H 9/54; H03H 9/706; H03H 9/02574; H03H 9/1085; H03H 9/0576; H03H 9/1071; H03H 9/725; H03H 9/059; H03H 9/02834; H03H 9/058; H03H 9/1064; H03H 9/6479

See application file for complete search history.

(56) References Cited

U.S. PATENT DOCUMENTS 7,154,206 B2 * 12/2006 Shimada ................... H03H 3/08
257/E23.128
7,180,228 B2 * 2/2007 Masuko ..................... H03H 3/08
310/348

(Continued)

FOREIGN PATENT DOCUMENTS

CN 1638272 A * 7/2005 ........... H03H 9/0576
CN 1638272 B * 6/2011 ........... H03H 9/1085

(Continued)

*Primary Examiner* — Pedro J Cuevas
(74) *Attorney, Agent, or Firm* — Keating & Bennett, LLP

(57) ABSTRACT

An acoustic wave device includes a package substrate including first and second principal surfaces, an acoustic wave element at the first principal surface, a sealing resin layer covering at least a portion of the acoustic wave element, and a metal shield film covering the sealing resin layer. The package substrate includes a ground connection electrode in the package substrate, electrically connected to the acoustic wave element, and connected to a ground potential. The package substrate includes a side surface and a connection portion connected to at least a portion of an end edge on a side with the second principal surface in the side surface and at least a portion of an outer peripheral edge in the second principal surface. The shield film reaches the side surface of the package substrate and does not reach the connection portion, and the shield film is connected to the ground connection electrode.

20 Claims, 7 Drawing Sheets

(51) Int. Cl.
  *H03H 9/10* (2006.01)
  *H03H 9/125* (2006.01)
  *H03H 9/54* (2006.01)
  *H03H 9/70* (2006.01)

(52) U.S. Cl.
  CPC .......... *H03H 9/1042* (2013.01); *H03H 9/125* (2013.01); *H03H 9/54* (2013.01); *H03H 9/706* (2013.01)

(56) References Cited

U.S. PATENT DOCUMENTS

| | | | | |
|---|---|---|---|---|
| 7,248,133 B2 * | 7/2007 | Koga | ........................ | H03H 3/08 29/25.35 |
| 7,282,835 B2 * | 10/2007 | Kawakami | ........... | H03H 9/1085 310/313 R |
| 7,841,076 B2 * | 11/2010 | Fujii | .................... | H01Q 13/106 343/895 |
| 7,935,573 B2 * | 5/2011 | Mizukoshi | .............. | H01L 24/16 438/455 |
| 8,749,114 B2 * | 6/2014 | Hatakeyama | ........ | H03H 9/1078 310/313 R |
| 8,836,449 B2 * | 9/2014 | Pang | .................... | H03H 9/0571 333/187 |
| 8,969,173 B2 * | 3/2015 | Oda | .................. | H01L 23/49805 438/458 |
| 9,133,021 B2 * | 9/2015 | Chang | ................. | B81C 1/00269 |
| 9,793,877 B2 * | 10/2017 | Martin | ..................... | H03H 9/17 |
| 11,616,486 B2 * | 3/2023 | Watanabe | .......... | H03H 9/02574 310/311 |
| 12,407,329 B2 * | 9/2025 | Kawasaki | ............ | H03H 9/6483 |
| 2005/0073040 A1 * | 4/2005 | Lee | ....................... | H03H 9/105 257/700 |
| 2006/0012450 A1 * | 1/2006 | Koga | .................... | H03H 3/08 333/193 |
| 2006/0131991 A1 * | 6/2006 | Kawakami | ........... | H03H 9/0585 310/311 |
| 2007/0200146 A1 * | 8/2007 | Onishi | ................. | H03H 9/0576 257/202 |
| 2009/0309673 A1 * | 12/2009 | Iwamoto | ................ | H03H 9/059 333/133 |
| 2011/0248389 A1 * | 10/2011 | Yorita | ................. | H01L 25/0652 257/659 |
| 2012/0049978 A1 * | 3/2012 | Pang | .................... | H03H 9/0547 333/189 |
| 2012/0181898 A1 * | 7/2012 | Hatakeyama | ............ | H03H 3/08 310/313 B |
| 2013/0057361 A1 * | 3/2013 | Sakano | .................. | H01L 23/315 333/193 |
| 2013/0337610 A1 * | 12/2013 | Oda | ......................... | H01L 21/78 438/113 |
| 2015/0181739 A1 * | 6/2015 | Fukuda | .................. | H01L 23/345 361/728 |
| 2018/0159508 A1 | 6/2018 | Irieda et al. | | |
| 2020/0204146 A1 * | 6/2020 | Watanabe | ........... | H03H 9/02574 |
| 2021/0297058 A1 * | 9/2021 | Yamazaki | ............ | H03H 9/1085 |
| 2024/0322788 A1 * | 9/2024 | Shoda | ................ | H03H 9/02574 |
| 2024/0364308 A1 * | 10/2024 | Yoshioka | ............. | H03H 9/6469 |
| 2025/0175143 A1 * | 5/2025 | Yanase | ................. | H03H 9/1071 |

FOREIGN PATENT DOCUMENTS

| | | | | |
|---|---|---|---|---|
| CN | 116073784 A | * | 5/2023 | ................ H03H 9/54 |
| CN | 118382997 A | * | 7/2024 | ......... H03H 9/02574 |
| JP | WO2009096563 A1 | * | 5/2011 | .............. H03H 9/059 |
| JP | 2014057124 A | * | 3/2014 | ................ H03H 9/25 |
| JP | WO2014050450 A1 | * | 8/2016 | ......... H03H 9/02913 |
| JP | 6026829 B2 | * | 11/2016 | ................ H03H 9/25 |
| JP | 2018-093388 A | | 6/2018 | |
| JP | 2020102768 A | * | 7/2020 | ......... H03H 9/02574 |
| JP | 7268643 B2 | * | 5/2023 | ......... H03H 9/02102 |
| JP | 2023068334 A | * | 5/2023 | ............. H03H 9/125 |
| KR | 20200078347 A | * | 7/2020 | ......... H03H 9/02937 |
| KR | 102320449 B1 | * | 11/2021 | ........... H03H 9/0222 |
| WO | WO-2023112652 A1 | * | 6/2023 | ......... H03H 9/02574 |

* cited by examiner

FIG. 3
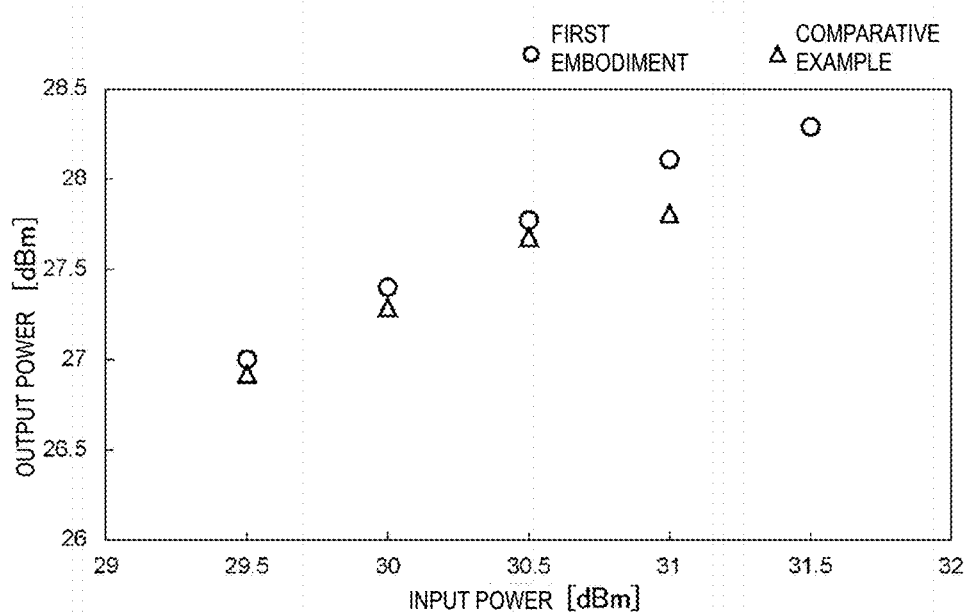
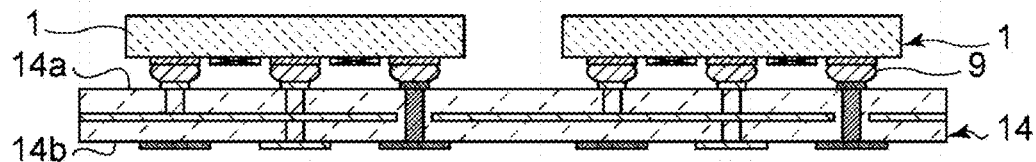
FIG. 4A
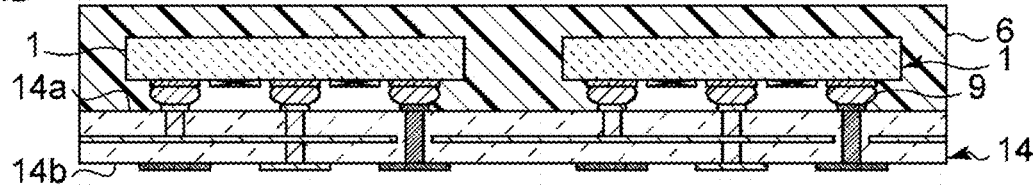
FIG. 4B
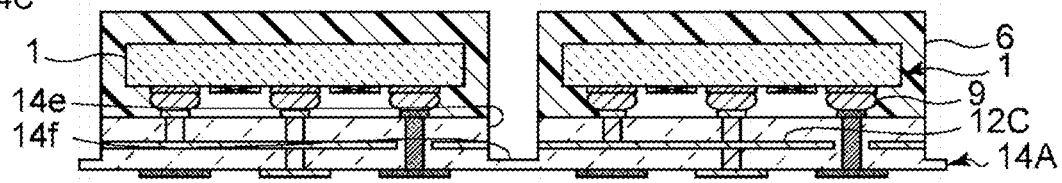
FIG. 4C
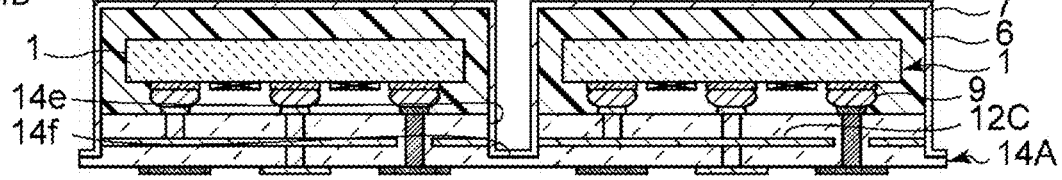
FIG. 4D

ACOUSTIC WAVE DEVICE

CROSS REFERENCE TO RELATED APPLICATIONS

This application claims the benefit of priority to Japanese Patent Application No. 2021-179336 filed on Nov. 2, 2021. The entire contents of this application are hereby incorporated herein by reference.

BACKGROUND OF THE INVENTION

1. Field of the Invention

The present invention relates to an acoustic wave device.

2. Description of the Related Art

Acoustic wave devices have been widely used in a filter of a mobile phone and the like. Japanese Unexamined Patent Application Publication No. 2018-093388 discloses an example of a filter having a piezoelectric thin-film resonator using acoustic waves. In the filter, a filter chip is flip-chip mounted on a substrate. A sealing portion is provided on the substrate. The filter chip is surrounded by the sealing portion. The sealing portion is covered with a protective film. The protective film is a metal film or an insulating film. Via wiring and a metal layer are provided in the substrate. The filter is electrically connected to the outside via the via wiring and the metal layer.

SUMMARY OF THE INVENTION

In the filter described in Japanese Unexamined Patent Application Publication No. 2018-093388, the via wiring and the metal layer in the substrate serve as a heat-dissipating path for heat generated in the filter. However, heat dissipation in the filter is insufficient.

Preferred embodiments of the present invention provide acoustic wave devices each capable of enhancing heat dissipation.

An acoustic wave device according to a broad aspect of a preferred embodiment of the present invention includes a package substrate including a first principal surface and a second principal surface which are opposed to each other, an acoustic wave element at the first principal surface of the package substrate, a sealing resin layer at the first principal surface of the package substrate and covering at least a portion of the acoustic wave element, and a metal shield film covering the sealing resin layer. The package substrate includes a ground connection electrode in the package substrate, electrically connected to the acoustic wave element, and connected to a ground potential. The package substrate includes a side surface connected to the first principal surface and a connection portion connected to at least a portion of an end edge on a side with the second principal surface in the side surface and at least a portion of an outer peripheral edge in the second principal surface. The connection portion is located inside a portion surrounded by an imaginary plane which is extended from the second principal surface and an imaginary plane which is extended from the side surface. The shield film reaches the side surface of the package substrate and does not reach the connection portion, and the shield film is connected to the ground connection electrode.

An acoustic wave device according to another broad aspect of another preferred embodiment of the present invention includes a package substrate including a first principal surface and a second principal surface which are opposed to each other, an acoustic wave element at the first principal surface of the package substrate, a sealing resin layer at the first principal surface of the package substrate and covering at least a portion of the acoustic wave element, and a non-metallic shield film covering the sealing resin layer. The package substrate includes a ground connection electrode in the package substrate, electrically connected to the acoustic wave element, and connected to a ground potential and a hot connection electrode in the package substrate, electrically connected to the acoustic wave element, and connected to a hot potential. The package substrate includes a side surface connected to the first principal surface and a connection portion connected to at least a portion of an end edge on a side with the second principal surface in the side surface and at least a portion of an outer peripheral edge in the second principal surface. The connection portion is located inside a portion surrounded by an imaginary plane extended from the second principal surface and an imaginary plane extended from the side surface. The shield film reaches the side surface of the package substrate and does not reach the connection portion, and the shield film is connected to at least one of the ground connection electrode and the hot connection electrode.

Acoustic wave devices according to preferred embodiments of the present invention achieve enhancement of heat dissipation.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a chart showing relationships between input power and output power in the first preferred embodiment of the present invention and a comparative example.

FIGS. 4A to 4D are schematic front sectional views for explaining an acoustic wave element mounting process, a sealing resin layer formation process, a sealing resin layer division process, a package substrate half-cut process, and a shield film formation process in an example of a method for manufacturing the acoustic wave device according to the first preferred embodiment of the present invention.

DETAILED DESCRIPTION OF THE PREFERRED EMBODIMENTS

The present invention will be clarified below by describing specific preferred embodiments of the present invention with reference to the drawings.

Note that the preferred embodiments described in the present specification are illustrative, and components in different preferred embodiments may be partially replaced or combined.

Figure 1:
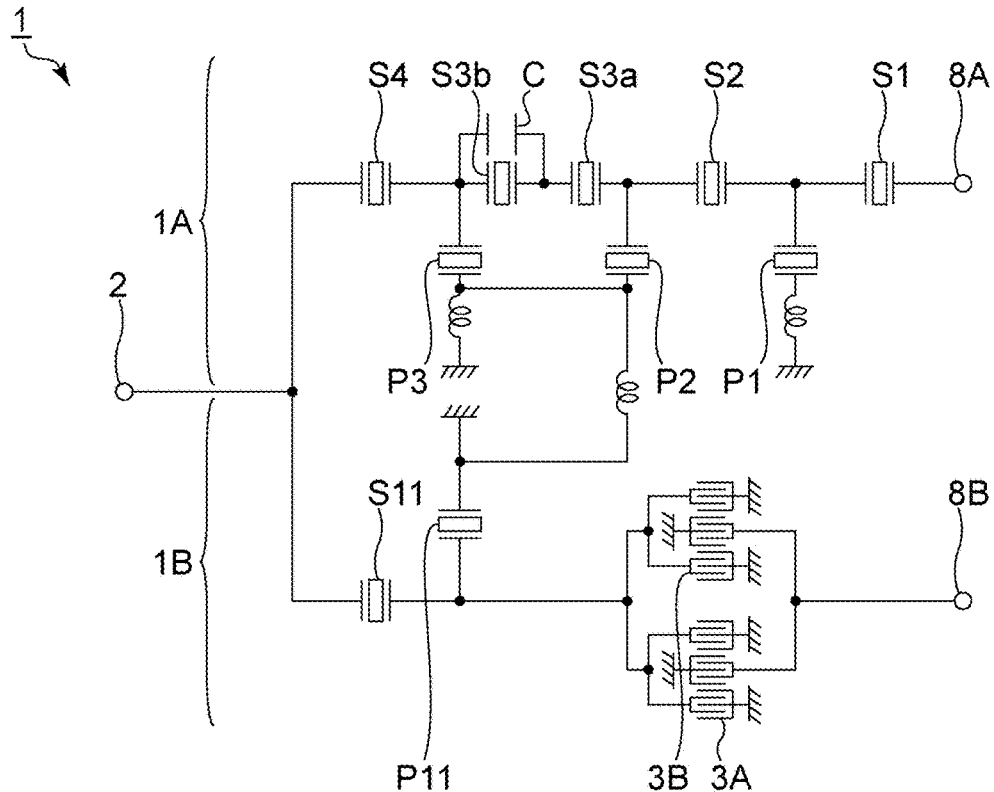
FIG. 1 is a schematic circuit diagram of an acoustic wave element according to a first preferred embodiment of the present invention.

FIG. 1 is a schematic circuit diagram of an acoustic wave element according to a first preferred embodiment of the present invention.

An acoustic wave device according to the present preferred embodiment includes an acoustic wave element 1. The acoustic wave element 1 is a duplexer. More specifically, the acoustic wave element 1 has a common connection terminal 2, a transmitting filter 1A, and a receiving filter 1B. The transmitting filter 1A and the receiving filter 1B are commonly connected to the common connection terminal 2. In the present preferred embodiment, the common connection terminal 2 is an antenna terminal. The antenna terminal is connected to an antenna. The common connection terminal 2 may be, for example, wiring or as an electrode pad.

The transmitting filter 1A is a ladder filter. The transmitting filter 1A has a plurality of series arm resonators and a plurality of parallel arm resonators. The plurality of series arm resonators and the plurality of parallel arm resonators in the transmitting filter 1A are all acoustic wave resonators. Meanwhile, the receiving filter 1B has a longitudinally coupled resonator-type acoustic wave filter 3A, a longitudinally coupled resonator-type acoustic wave filter 3B, a series arm resonator S11, and a parallel arm resonator P11. The series arm resonator S11 and the parallel arm resonator P11 are acoustic wave resonators for characteristics adjustment. Note that each acoustic wave resonator and each longitudinally coupled resonator-type acoustic wave filter are hereinafter sometimes simply referred to as resonators.

The acoustic wave element is a Band1 duplexer. More specifically, a pass band of the transmitting filter 1A is approximately 1920 MHz to 1980 MHz, for example. A pass band of the receiving filter 1B is approximately 2110 MHz to 2170 MHz, for example. A pass band of the acoustic wave element 1, however, is not limited to the above-described ones. A specific configuration of the acoustic wave device according to the present preferred embodiment will be described below.

Figure 2:
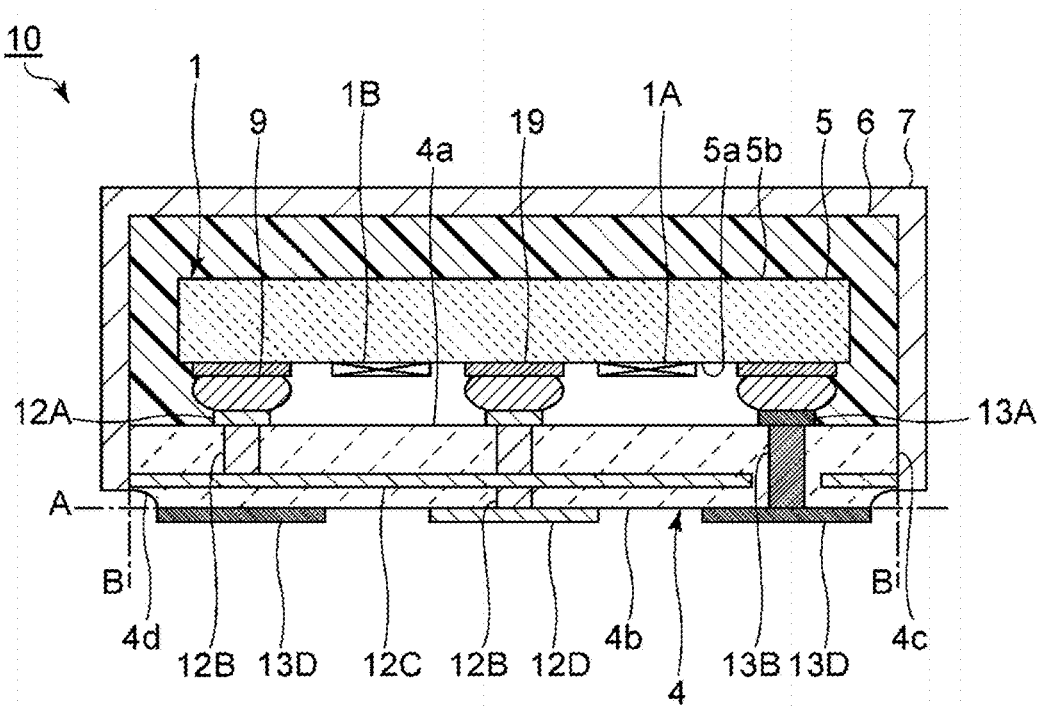
FIG. 2 is a schematic front sectional view of an acoustic wave device according to the first preferred embodiment of the present invention.

FIG. 2 is a schematic front sectional view of the acoustic wave device according to the first preferred embodiment. Referring to FIG. 2, a portion of an electrode structure in each of the transmitting filter 1A and the receiving filter 1B is indicated by a schematic representation having two diagonal lines added to a rectangle.

An acoustic wave device 10 has a package substrate 4. The package substrate 4 has a first principal surface 4a and a second principal surface 4b. The first principal surface 4a and the second principal surface 4b are opposed to each other. The above-described acoustic wave element 1 is provided at the first principal surface 4a. More specifically, the plurality of resonators of the transmitting filter 1A and the receiving filter 1B share a same piezoelectric substrate 5. For this reason, the transmitting filter 1A and the receiving filter 1B are regarded as one element chip. The acoustic wave element 1 as the element chip is flip-chip mounted on the first principal surface 4a of the package substrate 4. Specifically, the acoustic wave element 1 is joined to the package substrate 4 by a plurality of bumps 9. In the present preferred embodiment, the acoustic wave device 10 has a chip size package (CSP) structure. A structure of the acoustic wave device 10 may be, for example, such that the acoustic wave element 1 having a wafer level package (WLP) structure is mounted at the package substrate 4.

A sealing resin layer 6 is provided at the first principal surface 4a of the package substrate 4 so as to cover the acoustic wave element 1. A shield film 7 is further provided so as to cover the sealing resin layer 6. In the present preferred embodiment, the shield film 7 is a metal film. The shield film 7 functions as an electromagnetic shield. This allows curbing of degradation in electrical characteristics of the acoustic wave element 1 due to, for example, an unnecessary electric signal from the outside.

The package substrate 4 further has a side surface 4c and a connection portion 4d. The side surface 4c is connected to the first principal surface 4a. The connection portion 4d is connected to the whole of an end edge on the second principal surface 4b side in the side surface 4c and the whole of an outer peripheral edge in the second principal surface 4b. More specifically, in the package substrate 4 according to the present preferred embodiment, a recessed portion is provided over the whole of a portion facing the outer peripheral edge in the second principal surface 4b. The recessed portion also faces the whole of the end edge on the second principal surface 4b side in the side surface 4c. The portion constituting the recessed portion is the above-described connection portion 4d. Thus, the connection portion 4d is located inside a portion surrounded by an imaginary plane A which is extended from the second principal surface 4b and an imaginary plane B which is extended from the side surface 4c.

More specifically, the first principal surface 4a and the second principal surface 4b of the package substrate 4 have rectangular shapes. The package substrate 4 has four side surfaces 4c. In the acoustic wave device 10, four sides in the outer peripheral edge of the second principal surface 4b are all connected to the connection portion 4d. The connection portion 4d only needs to be connected to at least a portion of the end edge on the second principal surface 4b side in each side surface 4c and at least a portion of the outer peripheral edge in the second principal surface 4b. A portion of the side surfaces 4c and a portion of the second principal surface 4b may be connected. For example, at least one of the plurality of sides in the outer peripheral edge of the second principal surface 4b may be connected to the connection portion 4d, and at least one of the plurality of sides may be connected to the side surface 4c. Note that shapes of the first principal surface 4a and the second principal surface 4b are not limited to the rectangular shapes.

The package substrate 4 has at least one ground connection terminal 12A, a plurality of hot connection terminals 13A, a plurality of ground connection via electrodes 12B, a plurality of hot connection via electrodes 13B, at least one ground connection electrode 12C, at least one ground connection outer electrode 12D, and a plurality of hot connection outer electrodes 13D. The ground connection terminal 12A and the hot connection terminals 13A are provided at the first principal surface 4a of the package substrate 4. The ground connection via electrodes 12B, the hot connection via electrodes 13B, and the ground connection electrode 12C are provided in the package substrate 4. The ground connection outer electrode 12D and the hot connection outer electrodes 13D are provided at the second principal surface 4b. One of the plurality of ground connection via electrodes 12B connects the ground connection terminal 12A and the ground connection electrode 12C. Another one of the plurality of ground connection via electrodes 12B connects the ground connection electrode 12C and the ground connection outer electrode 12D. Meanwhile, the hot connection via electrode 13B connects the hot connection terminal 13A and the hot connection outer electrode 13D.

The acoustic wave element 1 is connected to an external ground potential via the bumps 9, the ground connection terminal 12A, the ground connection via electrodes 12B, the ground connection electrode 12C, and the ground connection outer electrode 12D. Meanwhile, the acoustic wave element 1 is connected to an external hot potential via the bumps 9, the hot connection terminals 13A, the hot connection via electrodes 13B, and the hot connection outer electrodes 13D. Note that one of the plurality of ground connection via electrodes 12B may connect the ground connection terminal 12A and the ground connection outer electrode 12D.

The feature of the present preferred embodiment lies in that the package substrate 4 has the above-described connection portion 4d, the shield film 7 reaches the side surfaces 4c of the package substrate 4 and does not reach the connection portion 4d, and the shield film 7 is connected to the ground connection electrode 12C. More specifically, an end portion of the ground connection electrode 12C is located at the side surface 4c of the package substrate 4. The shield film 7 is connected to the end portion. A heat-dissipating path for heat generated in the acoustic wave element 1 is, for example, a path which extends through the ground connection via electrodes 12B and the ground connection outer electrode 12D. The heat-dissipating path is a path which extends from the first principal surface 4a of the package substrate 4 to the second principal surface 4b. Additionally, in the present preferred embodiment, a heat-dissipating path which extends through the ground connection via electrode 12B, the ground connection electrode 12C, and the shield film 7 is provided. As described above, the acoustic wave device 10 also has a heat-dissipating path which extends from the first principal surface 4a of the package substrate 4 to the side surface 4c. This allows an effective increase in heat-dissipating paths. It is thus possible to effectively enhance heat dissipation.

Since heat dissipation can be enhanced in the present preferred embodiment, electric power handling capability can be enhanced. Details of the effect will be illustrated below by comparing the present preferred embodiment and a comparative example. Note that the comparative example is different from the present preferred embodiment in that a ground connection electrode is not connected to a shield film. Power application tests were conducted on the acoustic wave device according to the present preferred embodiment and an acoustic wave device according to the comparative example. Results of the tests are shown in FIG. 3.

FIG. 3 is a chart showing relationships between input power and output power in the first preferred embodiment and the comparative example.

As shown in FIG. 3, it is apparent that output power is higher for any input power in the first preferred embodiment than in the comparative example. In the comparative example, if input power is not less than 30.5 dBm, an increase in the input power leads only to a small increase in output power. In contrast, in the first preferred embodiment, even if input power is not less than 30.5 dBm, a rate of increase in output power caused by an increase in the input power is high.

Generally, output power increases with an increase in input power in a region where the input power is low. However, in a region where the input power is high, heat generation of each resonator increases a temperature of the resonator. For this reason, bands with small insertion losses in a receiving filter and a transmitting filter are shifted. Even if input power of a signal of the same frequency is increased, a rise in temperature makes the signal less likely to pass through the receiving filter and the transmitting filter. As a result, even if input power is increased, a rate of increase in output power is low.

In contrast, in the first preferred embodiment, heat dissipation can be enhanced in the acoustic wave device 10. This makes it possible to curb a rise in temperatures of the acoustic wave resonators and the longitudinally coupled resonator-type acoustic wave filters and curb changes in frequency characteristics. Thus, even if input power is increased, output power can be increased. As described above, electric power handling capability characteristics can be enhanced.

Referring back to FIG. 2, an area of the second principal surface 4b of the package substrate 4 is small in the small-sized acoustic wave device 10. This limits a heat-dissipating path. In the first preferred embodiment, however, the side surface 4c side can also be used as a heat-dissipating path. The present invention is thus particularly preferable if the acoustic wave device 10 is small-sized.

Additionally, in the first preferred embodiment, the connection portion 4d is provided at the package substrate 4. With this configuration, the acoustic wave device 10 can be more reliably miniaturized, and productivity can be enhanced. This will be described below together with an example of a method for manufacturing the acoustic wave device according to the first preferred embodiment.

Figure 5:
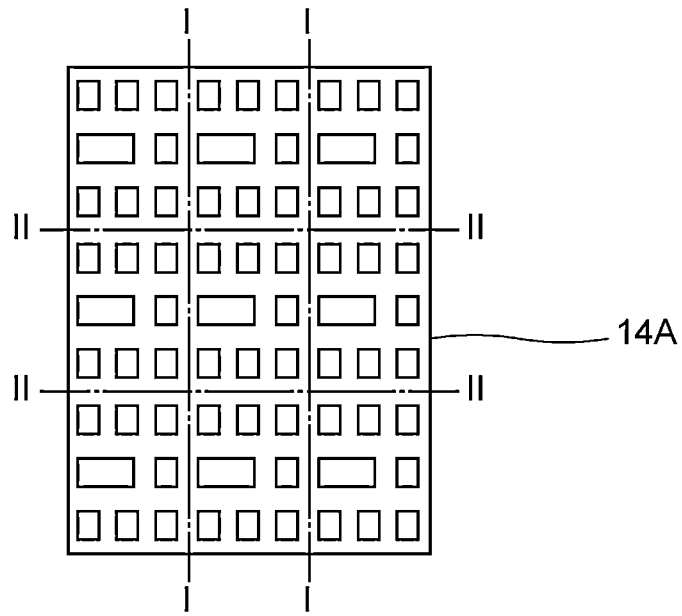
FIG. 5 is a bottom view for explaining a package substrate division process in the example of the method for manufacturing the acoustic wave device according to the first preferred embodiment of the present invention.

FIGS. 4A to 4D are schematic front sectional views for explaining an acoustic wave element mounting process, a sealing resin layer formation process, a sealing resin layer division process, a package substrate half-cut process, and a shield film formation process in the example of the method for manufacturing the acoustic wave device according to the first preferred embodiment. FIG. 5 is a bottom view for explaining a package substrate division process in the example of the method for manufacturing the acoustic wave device according to the first preferred embodiment. Note that a direction from below in FIG. 2 or the like is assumed as a bottom view in the present specification. A direction from above in FIG. 2 or the like is assumed as a plan view.

As shown in FIG. 4A, a package substrate 14 having a first principal surface 14a and a second principal surface 14b is prepared. A plurality of acoustic wave elements 1 are then provided at the first principal surface 14a of the package substrate 14. Specifically, each of the plurality of acoustic wave elements 1 is joined to the package substrate 14 by a plurality of bumps 9. Note that an electrode structure corresponding to the plurality of acoustic wave elements 1 is provided at the package substrate 14.

As shown in FIG. 4B, the sealing resin layer 6 is provided on the package substrate 14 so as to cover the plurality of acoustic wave elements 1. The sealing resin layer 6 is then cut from the first principal surface 14a side by, for example, a dicing machine, and the package substrate 14 is half cut. With this operation, the sealing resin layer 6 is divided, as shown in FIG. 4C. Additionally, a groove portion 14e is first formed in a package substrate 14A. At this time, the groove portion 14e is formed such that an end portion of the ground connection electrode 12C is exposed at the groove portion 14e. Note that the groove portion 14e includes a bottom portion 14f. Such half-cut portions are formed on lines overlapping with lines I-I and lines II-II in FIG. 5.

As shown in FIG. 4D, the shield film 7 is formed so as to cover the sealing resin layer 6 and the groove portion 14e. As described above, an end portion of each ground connection electrode 12C is exposed at the groove portion 14e. In the shield film formation process, the shield film 7 is connected to the ground connection electrode 12C. The shield film 7 can be formed by, for example, sputtering or vacuum vapor deposition.

As shown in FIG. 5, the package substrate 14A is cut along lines I-I and lines II-II. More specifically, the package substrate 14A is cut until the bottom portion 14f of each groove portion 14e shown in FIG. 4C is reached. At this time, the cutting of the package substrate 14A is performed from the second principal surface 14b side with a groove width wider than in the package substrate half-cut process shown in FIG. 4C. More specifically, the cutting of the package substrate 14A is performed such that a portion where the shield film 7 and the ground connection electrode 12C are connected is not reached. With this operation, the connection portion 4d of the package substrate 4 shown in FIG. 2 is formed. In the above-described manner, the package substrate 14A is divided into individual pieces. A plurality of acoustic wave devices 10 can be obtained.

In the package substrate division process shown in FIG. 5, the cutting is performed with the groove width wider than in the package substrate half-cut process shown in FIG. 4C, as described above. For this reason, even if a deviation of a cutting position in the package substrate 14A occurs, the small-sized package substrate 4 can be more reliably obtained. It is thus possible to more reliably miniaturize the acoustic wave device 10 and enhance the productivity.

In the above-described package substrate division process, a portion of an electrode on a principal surface of the package substrate 14A may be removed. A portion of the ground connection outer electrode 12D and a portion of each hot connection outer electrode 13D shown in FIG. 2 are removed in the process. Thus, each of the ground connection outer electrode 12D and the hot connection outer electrodes 13D is in contact with a border between the connection portion 4d and the second principal surface 4b of the package substrate 4. As described above, at least one of the ground connection outer electrode 12D and each hot connection outer electrode 13D is preferably in contact with the border between the connection portion 4d and the second principal surface 4b. In this case, an area of an electrode to be connected to the outside can be more reliably increased. This allows more reliable enhancement of heat dissipation. Both the ground connection outer electrode 12D and the hot connection outer electrode 13D need not be in contact with the border between the connection portion 4d and the second principal surface 4b.

Formation of the connection portion 4d of the package substrate 4 is performed after formation of the shield film 7. Thus, the shield film 7 does not reach the connection portion 4d of the package substrate 4. This makes it difficult for the shield film 7 and the hot connection outer electrode 13D to be short-circuited.

A circuit configuration of the acoustic wave element 1 according to the first preferred embodiment will be described below.

As shown in FIG. 1, the transmitting filter 1A has a first signal terminal 8A, a plurality of series arm resonators, a plurality of parallel arm resonators, and a capacitive element C. More specifically, the plurality of series arm resonators include a series arm resonator S1, a series arm resonator S2, a series arm resonator S3a, a series arm resonator S3b, and a series arm resonator S4. The plurality of parallel arm resonators include a parallel arm resonator P1, a parallel arm resonator P2, and a parallel arm resonator P3. The first signal terminal 8A is an input terminal.

The series arm resonator S1, the series arm resonator S2, the series arm resonator S3a, the series arm resonator S3b, and the series arm resonator S4 are series-connected to one another between the first signal terminal 8A and the common connection terminal 2. The parallel arm resonator P1 is connected between a ground potential and a junction between the series arm resonator S1 and the series arm resonator S2. The parallel arm resonator P2 is connected between the ground potential and a junction between the series arm resonator S2 and the series arm resonator S3a. The parallel arm resonator P3 is connected between the ground potential and a junction between the series arm resonator S3b and the series arm resonator S4. Note that the capacitive element C is connected in parallel with the series arm resonator S3b.

As described above, the receiving filter 1B has the longitudinally coupled resonator-type acoustic wave filter 3A, the longitudinally coupled resonator-type acoustic wave filter 3B, the series arm resonator S11, and the parallel arm resonator P11. The receiving filter 1B further has a second signal terminal 8B. The second signal terminal 8B is an output terminal. The second signal terminal 8B may be, for example, constructed as wiring or as an electrode pad. The same applies to the above-described first signal terminal 8A.

The longitudinally coupled resonator-type acoustic wave filter 3A and the longitudinally coupled resonator-type acoustic wave filter 3B are connected in parallel with each other between the common connection terminal 2 and the second signal terminal 8B. The series arm resonator S11 is connected between the common connection terminal 2 and the longitudinally coupled resonator-type acoustic wave filters 3A and 3B. The parallel arm resonator P11 is connected between the ground potential and a junction between the series arm resonator S11 and the longitudinally coupled resonator-type acoustic wave filters 3A and 3B. The parallel arm resonator P11 of the receiving filter 1B, and the parallel arm resonator P2 and the parallel arm resonator P3 of the transmitting filter 1A are commonly connected to the ground potential.

Note that the circuit configuration of the acoustic wave element 1 is not limited to the above-described one. Additionally, the acoustic wave element 1 is not limited to a duplexer. The acoustic wave element 1 may be, for example, a transmitting filter or a receiving filter or may be a multiplexer or the like. In addition, the acoustic wave element 1 may be, for example, a one-port acoustic wave resonator.

Specific configurations of an acoustic wave resonator and a longitudinally coupled resonator-type acoustic wave filter according to the first preferred embodiment will be illustrated below.

Figure 6:
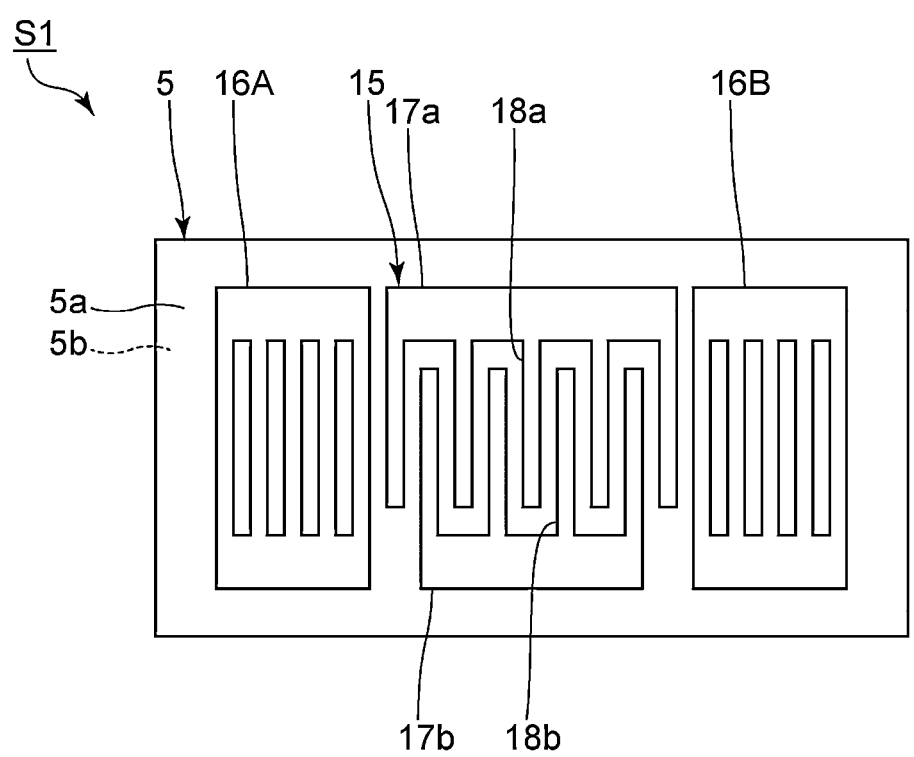
FIG. 6 is a bottom view showing an electrode configuration of a series arm resonator in a transmitting filter according to the first preferred embodiment of the present invention.

FIG. 6 is a bottom view showing an electrode configuration of a series arm resonator in a transmitting filter according to the first preferred embodiment. Referring to FIG. 6, wiring connected to the series arm resonator S1 is not shown.

The series arm resonator S1 includes the piezoelectric substrate 5. As described above, the plurality of resonators of the transmitting filter 1A and the receiving filter 1B share the same piezoelectric substrate 5. In the present preferred embodiment, the piezoelectric substrate 5 is a substrate which is composed only of a piezoelectric layer. The piezoelectric layer is made of lithium tantalate. In the present specification, the statement that a given member is made of a given material includes a case where impurities, an amount of which is small enough to avoid degradation in electrical characteristics of an acoustic wave device, are contained. A material for the piezoelectric layer is not limited to the above-described one, and, for example, lithium niobate, zinc oxide, aluminum nitride, crystal, lead zirconate titanate (PZT), or the like can be used. Note that the piezoelectric substrate 5 may be a multilayer substrate including a piezoelectric layer.

The piezoelectric substrate 5 has a third principal surface 5a and a fourth principal surface 5b. The third principal surface 5a and the fourth principal surface 5b are opposed to each other. Of the third principal surface 5a and the fourth principal surface 5b, the third principal surface 5a is located on the package substrate 4 side. An interdigital transducer (IDT) electrode 15 is provided at the third principal surface 5a. Application of an AC voltage to the IDT electrode 15 excites acoustic waves. One pair of reflectors 16A and 16B is provided on both sides in an acoustic wave propagation direction of the IDT electrode 15 at the third principal surface 5a.

The IDT electrode 15 has a first busbar 17a, a second busbar 17b, a plurality of first electrode fingers 18a, and a plurality of second electrode fingers 18b. The first busbar 17a and the second busbar 17b are opposed to each other. Respective one ends of the plurality of first electrode fingers 18a are connected to the first busbar 17a. Respective one ends of the plurality of second electrode fingers 18b are connected to the second busbar 17b. The plurality of first electrode fingers 18a and the plurality of second electrode fingers 18b interdigitate with each other. Note that the first electrode fingers 18a and the second electrode fingers 18b are hereinafter sometimes simply referred to as electrode fingers. If a direction in which the plurality of electrode fingers extend is assumed as an electrode finger extension direction, the electrode finger extension direction and the acoustic wave propagation direction are orthogonal to each other in the first preferred embodiment.

Each of the acoustic wave resonators other than the series arm resonator S1 has an IDT electrode and reflectors, like the series arm resonator S1. In the first preferred embodiment, the plurality of series arm resonators and the plurality of parallel arm resonators are all surface acoustic wave resonators, for example.

Figure 7:
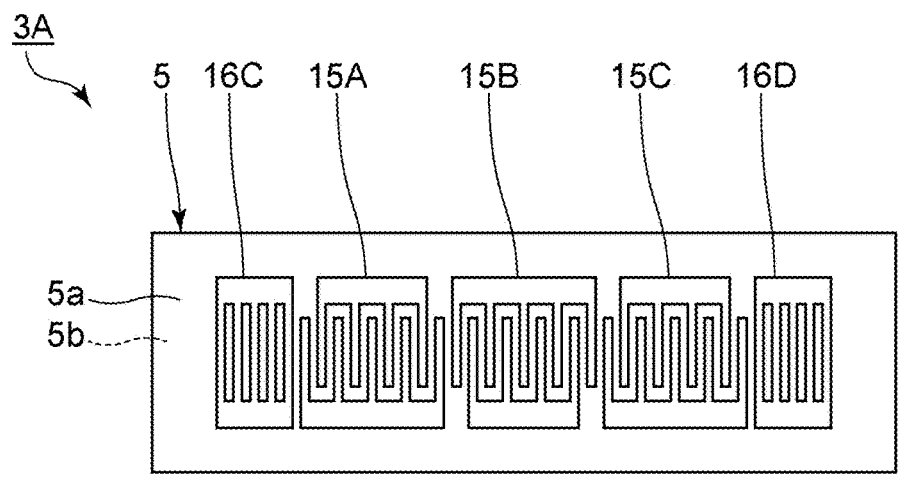
FIG. 7 is a bottom view showing an electrode configuration of a longitudinally coupled resonator-type acoustic wave filter in a receiving filter according to the first preferred embodiment of the present invention.

FIG. 7 is a bottom view showing an electrode configuration of a longitudinally coupled resonator-type acoustic wave filter in a receiving filter according to the first preferred embodiment. Referring to FIG. 7, wiring connected to the longitudinally coupled resonator-type acoustic wave filter 3A is not shown.

The longitudinally coupled resonator-type acoustic wave filter 3A has the above-described piezoelectric substrate 5. An IDT electrode 15A, an IDT electrode 15B, and an IDT electrode 15C are provided at the third principal surface 5a of the piezoelectric substrate 5. The IDT electrode 15A, the IDT electrode 15B, and the IDT electrode 15C are lined up along an acoustic wave propagation direction. One pair of reflectors 16C and 16D is provided on both sides in the acoustic wave propagation direction of the IDT electrode 15A, the IDT electrode 15B, and the IDT electrode 15C at the third principal surface 5a. The longitudinally coupled resonator-type acoustic wave filter 3A is of a 3IDT type. The number of IDT electrodes in the longitudinally coupled resonator-type acoustic wave filter 3A, however, is not limited to the above-described one. The longitudinally coupled resonator-type acoustic wave filter 3A may be, for example, of a 5IDT type, a 7IDT type, or the like. The longitudinally coupled resonator-type acoustic wave filter 3B similarly has a plurality of IDT electrodes and a plurality of reflectors.

Referring back to FIG. 2, a plurality of terminals for external connection are provided at the third principal surface 5a of the piezoelectric substrate 5. Each terminal for external connection is constructed as an electrode pad in the present preferred embodiment. Respective bumps 9 are joined to the plurality of terminals for external connection. The plurality of terminals for external connection include a ground connection electrode pad 19. The ground connection electrode pad 19 is electrically connected to the ground connection terminal 12A via the bump 9. The plurality of terminals for external connection also include the first signal terminal 8A, the second signal terminal 8B, and the common connection terminal 2 shown in FIG. 1. The first signal terminal 8A, the second signal terminal 8B, and the common connection terminal 2 are electrically connected to separate hot connection terminals 13A via the respective bumps 9.

Figure 8:
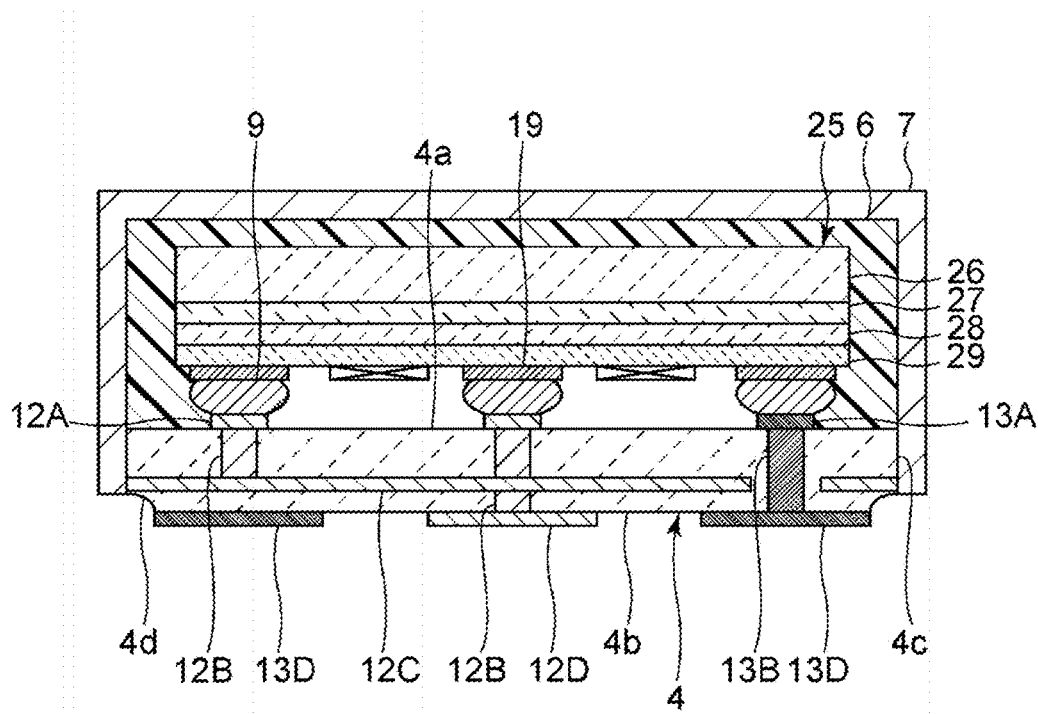
FIG. 8 is a schematic front sectional view of an acoustic wave device according to a first modification of the first preferred embodiment of the present invention.

As described above, the piezoelectric substrate 5 according to the first preferred embodiment is composed only of the piezoelectric layer. The piezoelectric substrate 5, however, may be a multilayer substrate including a piezoelectric layer. For example, in a first modification of the first preferred embodiment shown in FIG. 8, a piezoelectric substrate 25 has a support substrate 26, a high-acoustic-velocity film 27 as a high-acoustic-velocity material layer, a low-acoustic-velocity film 28, and a piezoelectric layer 29. More specifically, the support substrate 26, the high-acoustic-velocity film 27, the low-acoustic-velocity film 28, and the piezoelectric layer 29 are stacked in this order. In the present modification, the shield film 7 is connected to the ground connection electrode 12C, as in the first preferred embodiment. This allows enhancement of heat dissipation.

Note that the low-acoustic-velocity film 28 is a film with a relatively low acoustic velocity. More specifically, an acoustic velocity of a bulk wave propagating through the low-acoustic-velocity film 28 is lower than an acoustic velocity of a bulk wave propagating through the piezoelectric layer 29. For example, a material having, as a main ingredient, glass, silicon oxide, silicon oxynitride, lithium oxide, tantalum pentoxide, or a compound obtained by adding fluorine, carbon, or boron to silicon oxide can be used as a material for the low-acoustic-velocity film 28.

A high-acoustic-velocity material layer is a layer with a relatively high acoustic velocity. In the present modification, the high-acoustic-velocity material layer is the high-acoustic-velocity film 27. An acoustic velocity of a bulk wave propagating through the high-acoustic-velocity material layer is higher than an acoustic velocity of an acoustic wave propagating through the piezoelectric layer 29. For example, silicon, aluminum oxide, silicon carbide, silicon nitride, silicon oxynitride, sapphire, lithium tantalate, lithium niobate, crystal, alumina, zirconia, cordierite, mullite, steatite, forsterite, magnesia, a diamond-like carbon (DLC) film, diamond, or the like, or a medium having, as a main ingredient, any of the above-described materials can be used as a material for the high-acoustic-velocity material layer.

For example, a piezoelectric material, such as aluminum oxide, lithium tantalate, lithium niobate, or crystal; every type of ceramic, such as alumina, sapphire, magnesia, silicon nitride, aluminum nitride, silicon carbide, zirconia, cordierite, mullite, steatite, or forsterite; a dielectric, such as diamond or glass; a semiconductor, such as silicon or gallium nitride; a resin; or the like can be used as a material for the support substrate 26.

In the present modification, the high-acoustic-velocity film 27 as the high-acoustic-velocity material layer, the low-acoustic-velocity film 28, and the piezoelectric layer 29 are stacked in this order in the piezoelectric substrate 25. With this configuration, energy of acoustic waves can be effectively confined to the piezoelectric layer 29 side.

Note that a multilayer structure of the piezoelectric substrate is not limited to the above-described one. For example, the piezoelectric substrate may be a multilayer substrate having a support substrate, a high-acoustic-velocity film, and a piezoelectric layer. Additionally, the high-acoustic-velocity material layer may be a high-acoustic-velocity support substrate. In this case, the piezoelectric substrate may be a multilayer substrate having a high-acoustic-velocity support substrate, a low-acoustic-velocity film, and a piezoelectric layer or a multilayer substrate having a high-acoustic-velocity support substrate and a piezoelectric layer. Even in these cases, energy of acoustic waves can be effectively confined to the piezoelectric layer side. Moreover, heat dissipation can be enhanced, as in the first modification.

Figure 9:
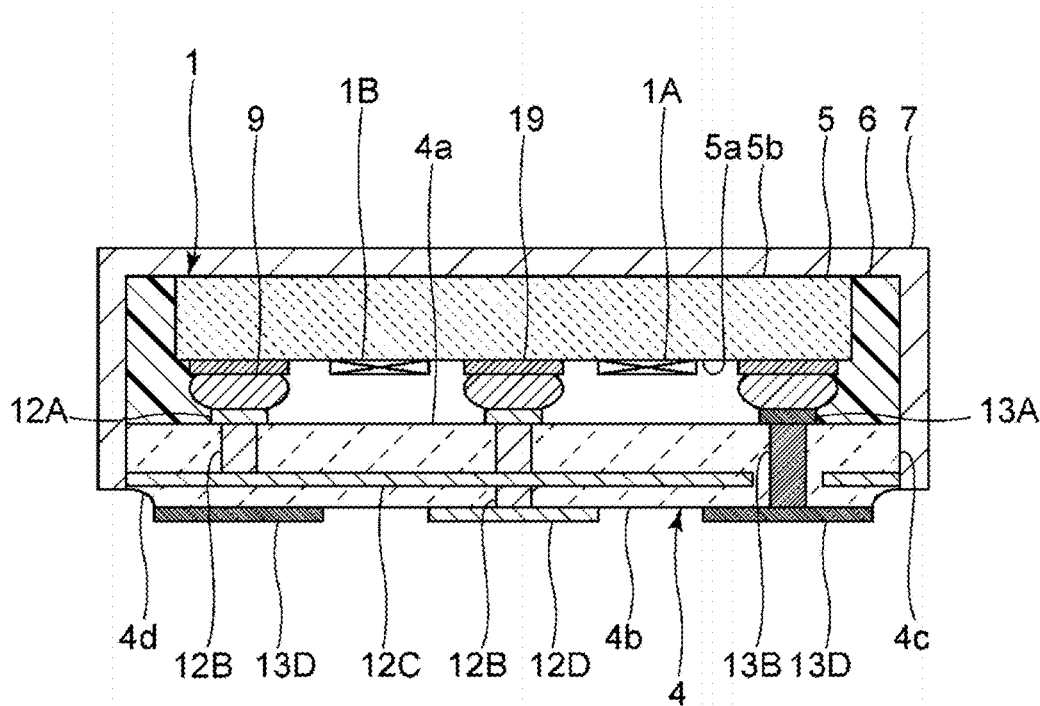
FIG. 9 is a schematic front sectional view of an acoustic wave device according to a second modification of the first preferred embodiment of the present invention.

In the first preferred embodiment, the sealing resin layer 6 covers the fourth principal surface 5b of the piezoelectric substrate 5. The sealing resin layer 6 only needs to be provided at the first principal surface 4a of the package substrate 4 so as to cover at least a portion of the acoustic wave element 1. For example, in a second modification of the first preferred embodiment shown in FIG. 9, the sealing resin layer 6 covers a side surface of the piezoelectric substrate 5 but does not cover the fourth principal surface 5b. The sealing resin layer 6 is flush with the fourth principal surface 5b. In the present modification, the shield film 7 covers the sealing resin layer 6 and the fourth principal surface 5b. Even in this case, heat dissipation can be enhanced, as in the first preferred embodiment.

Figure 10:
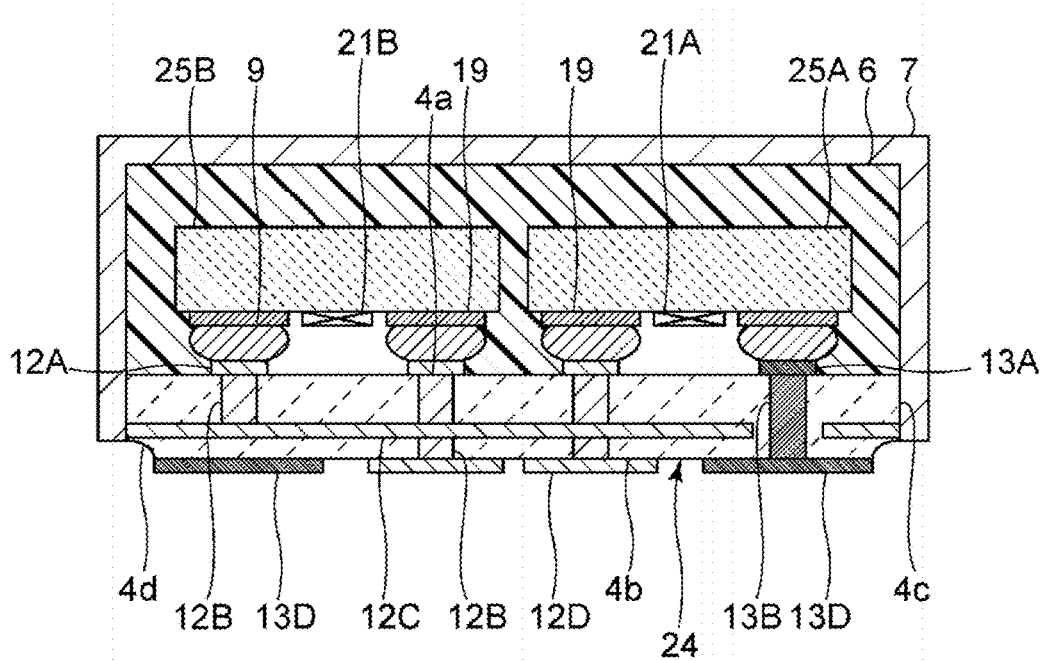
FIG. 10 is a schematic front sectional view of an acoustic wave device according to a third modification of the first preferred embodiment of the present invention.

In the acoustic wave device 10, all resonators share the same piezoelectric substrate 5. The acoustic wave element 1 is flip-chip mounted as one element chip on the package substrate 4. The acoustic wave device 10, however, is not limited to this. For example, as in a third modification shown in FIG. 10, a transmitting filter 21A and a receiving filter 21B may have piezoelectric substrates different from each other. In the present modification, all resonators of the transmitting filter 21A share a piezoelectric substrate 25A. All resonators of the receiving filter 21B share a piezoelectric substrate 25B. The transmitting filter 21A and the receiving filter 21B are individual element chips. An acoustic wave element according to the present modification is flip-chip mounted as two element chips on a package substrate 24. In the package substrate 24, wiring is provided to correspond to the number of element chips. The sealing resin layer 6 is provided so as to cover the element chips. In the present modification, the shield film 7 is connected to the ground connection electrode 12C, as in the first preferred embodiment. This allows enhancement of heat dissipation.

Note that the number of piezoelectric substrates is not particularly limited and that, for example, each resonator may have a separate piezoelectric substrate. Three or more element chips may be flip-chip mounted on the package substrate 24. Even in this case, heat dissipation can be enhanced, as in the third modification.

Referring back to FIG. 2, the connection portion 4d of the package substrate 4 has a shape like a curved surface in the first preferred embodiment. The connection portion 4d, however, may have, for example, a shape obtained by connecting a plurality of flat surfaces. The plurality of flat surfaces are, for example, different from each other in an angle of inclination to the second principal surface 4b.

Figure 11:
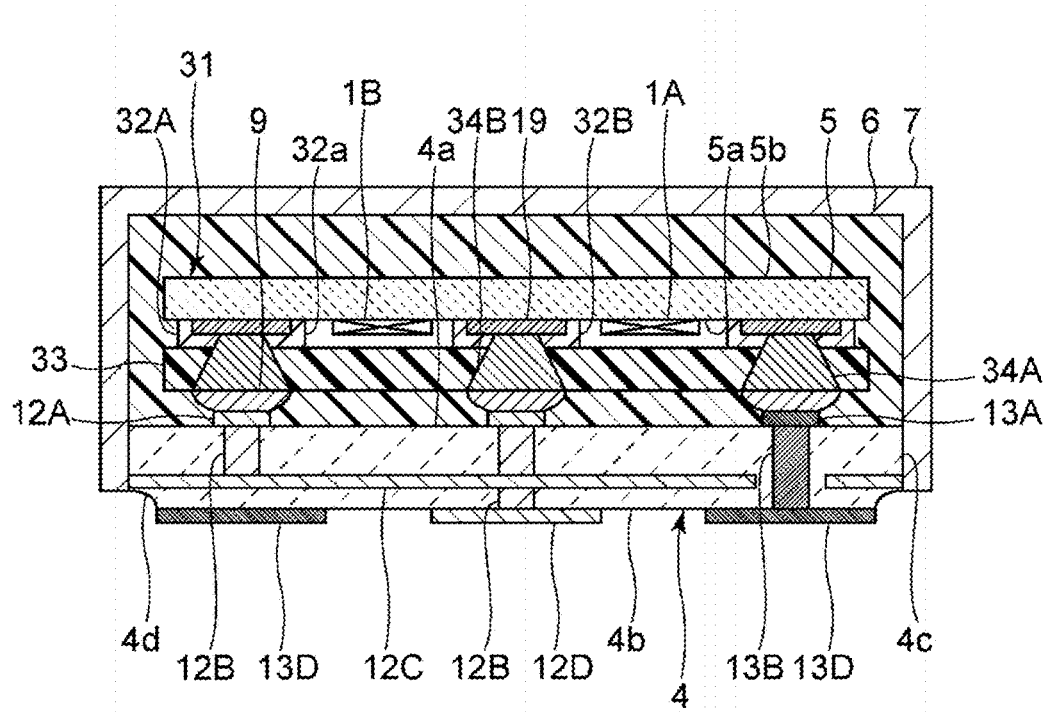
FIG. 11 is a schematic front sectional view of an acoustic wave device according to a second preferred embodiment of the present invention.

FIG. 11 is a schematic front sectional view of an acoustic wave device according to a second preferred embodiment.

The present preferred embodiment is different from the first preferred embodiment in that an acoustic wave element 31 has a WLP structure. The present preferred embodiment has the same configuration as the acoustic wave device 10 according to the first preferred embodiment except for the above-described point.

A first support member 32A and a second support member 32B are provided at a third principal surface 5a of a piezoelectric substrate 5. Note that the first support member 32A is a support member according to the present invention. The first support member 32A is provided so as to surround a plurality of IDT electrodes in a plurality of resonators. The first support member 32A has a frame-like shape. More specifically, the first support member 32A has a cavity 32a. The plurality of IDT electrodes are located in the cavity 32a. A plurality of terminals for external connection are provided at the third principal surface 5a, as in the first preferred embodiment. The first support member 32A covers at least one or ones of the plurality of terminals for external connection.

The second support member 32B is located in the cavity 32a of the first support member 32A. The second support member 32B has a columnar shape. The second support member 32B, however, may have a wall-like shape. The second support member 32B covers at least one or ones of the terminals for external connection. A cover member 33 is provided on the first support member 32A and the second support member 32B. The cover member 33 is provided so as to close the cavity 32a of the first support member 32A. The plurality of IDT electrodes are surrounded by the piezoelectric substrate 5, the first support member 32A, and the cover member 33.

A plurality of through-electrodes 34A are provided so as to extend through the cover member 33 and the first support member 32A. Similarly, a through-electrode 34B is provided so as to extend through the cover member 33 and the second support member 32B. Respective one ends of the through-electrodes 34A and the through-electrode 34B are connected to terminals for external connection. Respective bumps 9 are joined to the other ends of the through-electrodes 34A and the through-electrode 34B. The acoustic wave element 31 is joined to a package substrate 4 by the plurality of bumps 9.

In the present preferred embodiment, a shield film 7 is connected to a ground connection electrode 12C, as in the first preferred embodiment. This allows enhancement of heat dissipation.

Figure 12:
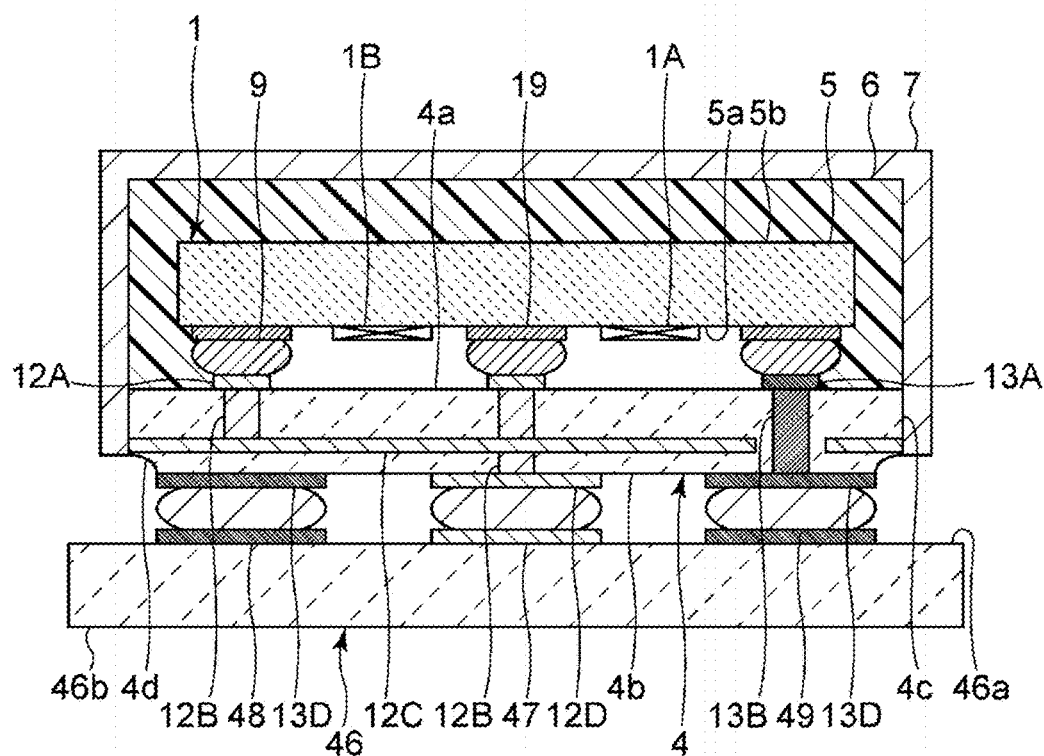
FIG. 12 is a schematic front sectional view of an acoustic wave device according to a third preferred embodiment of the present invention.

FIG. 12 is a schematic front sectional view of an acoustic wave device according to a third preferred embodiment.

The present preferred embodiment is different from the first preferred embodiment in that the present preferred embodiment has a mounting board 46. A package substrate 4 is provided above the mounting board 46. The acoustic wave device according to the present preferred embodiment has the same configuration as the acoustic wave device 10 according to the first preferred embodiment except for the above-described point.

The mounting board 46 has a fifth principal surface 46a and a sixth principal surface 46b. The fifth principal surface 46a and the sixth principal surface 46b are opposed to each other. Of the fifth principal surface 46a and the sixth principal surface 46b, the fifth principal surface 46a is located on the package substrate 4 side. The mounting board 46 has at least one ground electrode 47 and a plurality of hot electrodes 48. The ground electrode 47 and the hot electrodes 48 are provided at the fifth principal surface 46a.

The package substrate 4 is joined to the mounting board 46 by a plurality of bumps 49. More specifically, a ground connection outer electrode 12D of the package substrate 4 is joined to the ground electrode 47 by the bump 49. A hot connection outer electrode 13D is joined to the hot electrode 48 by the bump 49. An acoustic wave element 1 is electrically connected to the mounting board 46 via the package substrate 4.

In the present preferred embodiment, a shield film 7 is connected to a ground connection electrode 12C, as in the first preferred embodiment. This allows enhancement of heat dissipation.

Figure 13:
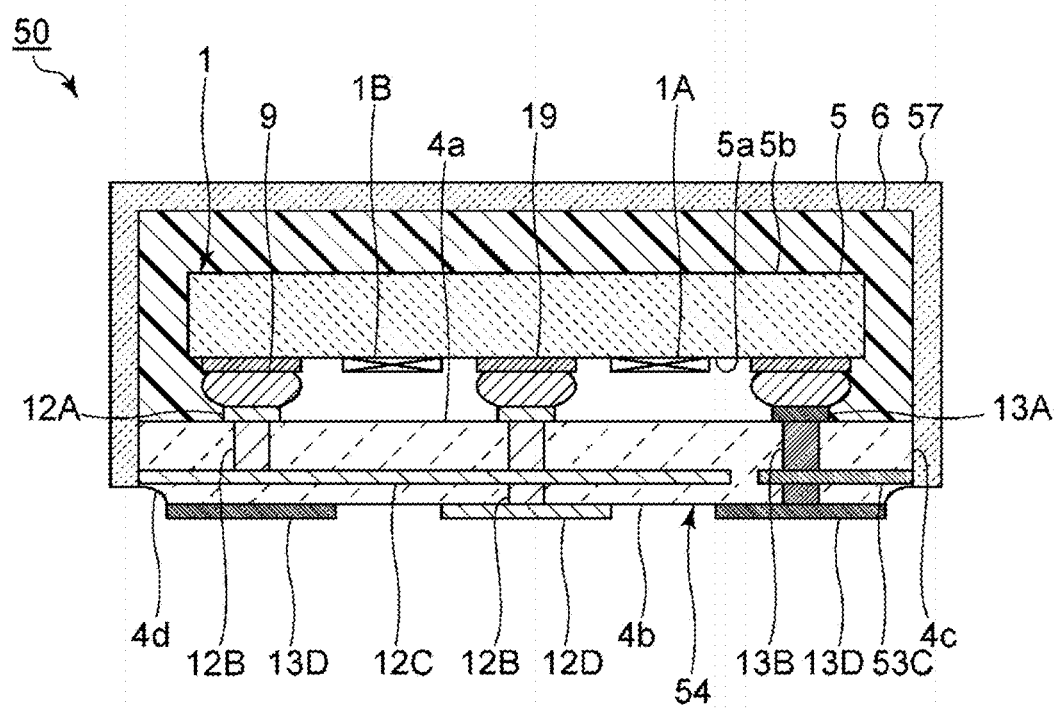
FIG. 13 is a schematic front sectional view of an acoustic wave device according to a fourth preferred embodiment of the present invention.

FIG. 13 is a schematic front sectional view of an acoustic wave device according to a fourth preferred embodiment.

The present preferred embodiment is different from the first preferred embodiment in that a shield film 57 is a non-metallic film. The present preferred embodiment is also different from the first preferred embodiment in that a hot connection electrode 53C is provided in a package substrate 54 and that the shield film 57 is connected to the hot connection electrode 53C. An acoustic wave device 50 according to the present preferred embodiment has the same configuration as the acoustic wave device 10 according to the first preferred embodiment except for the above-described points.

The hot connection electrode 53C is connected to a hot connection terminal 13A by one of a plurality of hot connection via electrodes 13B. The hot connection electrode 53C is also connected to a hot connection outer electrode 13D by another one of the plurality of hot connection via electrodes 13B. An end portion of the hot connection electrode 53C is located at a side surface 4c of the package substrate 54. The shield film 57 is connected to the end portion. Since the shield film 57 is a non-metallic film, even if the shield film 57 is connected to the hot connection electrode 53C, electrical characteristics of the acoustic wave device 50 are unlikely to degrade.

A heat-dissipating path for heat generated in an acoustic wave element 1 is, for example, a path which extends through the hot connection via electrodes 13B and the hot connection outer electrode 13D. The heat-dissipating path is a path which extends from a first principal surface 4a of the package substrate 54 to a second principal surface 4b. Additionally, in the present preferred embodiment, a heat-dissipating path which extends through the hot connection via electrode 13B, the hot connection electrode 53C, and the shield film 57 is provided. As described above, the acoustic wave device 50 also has a heat-dissipating path which extends from the first principal surface 4a of the package substrate 54 to the side surface 4c. This allows an effective increase in heat-dissipating paths. It is thus possible to effectively enhance heat dissipation.

As in the first preferred embodiment, the shield film 57 is also connected to a ground connection electrode 12C. The shield film 57 is a non-metallic film and has a low electrical resistance. For this reason, the shield film 57 does not electrically connect the ground connection electrode 12C and the hot connection electrode 53C. The electrical characteristics of the acoustic wave device 50 are thus unlikely to degrade.

In the present preferred embodiment, the shield film 57 is connected to both the ground connection electrode 12C and the hot connection electrode 53C. Thus, the heat dissipation can be further enhanced. Note that the shield film 57 only needs to be connected to at least one of the ground connection electrode 12C and the hot connection electrode 53C. This allows effective enhancement of the heat dissipation.

A non-metal high in heat dissipation, such as silicon nitride, is preferably used as a material for the shield film 57. In this case, the heat dissipation can be more reliably enhanced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a package substrate including a first principal surface and a second principal surface which are opposed to each other;
   an acoustic wave element at the first principal surface of the package substrate;
   a sealing resin layer at the first principal surface of the package substrate and covering at least a portion of the acoustic wave element; and
   a metal shield film covering the sealing resin layer; wherein
   the package substrate includes a ground connection electrode in the package substrate, electrically connected to the acoustic wave element, and connected to a ground potential;
   the package substrate includes a side surface connected to the first principal surface and a connection portion connected to at least a portion of an end edge on a side with the second principal surface in the side surface and at least a portion of an outer peripheral edge in the second principal surface; and
   the connection portion is located inside a portion surrounded by an imaginary plane extended from the second principal surface and an imaginary plane extended from the side surface; and
   the shield film reaches the side surface of the package substrate and does not reach the connection portion, and the shield film is connected to the ground connection electrode.

2. The acoustic wave device according to claim 1, wherein an end portion of the ground connection electrode is located at the side surface of the package substrate, and the shield film is connected to the end portion.

3. The acoustic wave device according to claim 1, wherein a whole of the end edge on the side with the second principal surface in the side surface of the package substrate and a whole of the outer peripheral edge in the second principal surface are connected to the connection portion.

4. The acoustic wave device according to claim 1, further comprising:
a mounting board; wherein
the package substrate is located above the mounting board, and the acoustic wave element is electrically connected to the mounting board via the package substrate.

5. The acoustic wave device according to claim 1, wherein
the acoustic wave element includes a piezoelectric substrate, at least one acoustic wave resonator on the piezoelectric substrate, a terminal electrically connected to the at least one acoustic wave resonator for external connection, and a bump joined to the terminal for external connection; and
the acoustic wave element is joined to the package substrate by the bump.

6. The acoustic wave device according to claim 1, wherein
the acoustic wave element includes a piezoelectric substrate, at least one acoustic wave resonator on the piezoelectric substrate, a terminal electrically connected to the at least one acoustic wave resonator for external connection, a support including a cavity surrounding the at least one acoustic wave resonator and provided on the piezoelectric substrate so as to cover at least a portion of the terminal for external connection, a cover on the support to close the cavity, a through-electrode extending through the cover and the support and connected to the terminal for external connection, and a bump joined to the through-electrode, and
the acoustic wave element is joined to the package substrate by the bump.

7. The acoustic wave device according to claim 1, wherein the acoustic wave element is one of a duplexer, a transmitting filter, a receiving filter, a multiplexer, or a one-port acoustic wave resonator.

8. The acoustic wave device according to claim 1, wherein the acoustic wave element includes a common connection terminal, a transmitting filter, and a receiving filter, and the transmitting filter and the receiving filter are commonly connected to the common connection terminal.

9. The acoustic wave device according to claim 8, wherein the common connection terminal is an antenna terminal.

10. The acoustic wave device according to claim 1, wherein the metal shield film defines a electromagnetic shield.

11. An acoustic wave device comprising:
a package substrate including a first principal surface and a second principal surface which are opposed to each other;
an acoustic wave element at the first principal surface of the package substrate;
a sealing resin layer at the first principal surface of the package substrate and covering at least a portion of the acoustic wave element; and
a non-metallic shield film covering the sealing resin layer; wherein
the package substrate includes a ground connection electrode in the package substrate, electrically connected to the acoustic wave element, and connected to a ground potential and a hot connection electrode in the package substrate, electrically connected to the acoustic wave element, and connected to a hot potential;
the package substrate includes a side surface connected to the first principal surface and a connection portion connected to at least a portion of an end edge on a side with the second principal surface in the side surface and at least a portion of an outer peripheral edge in the second principal surface; and
the connection portion is located inside a portion surrounded by an imaginary plane extended from the second principal surface and an imaginary plane extended from the side surface; and
the shield film reaches the side surface of the package substrate and does not reach the connection portion, and the shield film is connected to at least one of the ground connection electrode and the hot connection electrode.

12. The acoustic wave device according to claim 11, wherein an end portion of the hot connection electrode is located at the side surface of the package substrate, and the shield film is connected to the end portion.

13. The acoustic wave device according to claim 11, wherein an end portion of the ground connection electrode is located at the side surface of the package substrate, and the shield film is connected to the end portion.

14. The acoustic wave device according to claim 11, wherein a whole of the end edge on the side with the second principal surface in the side surface of the package substrate and a whole of the outer peripheral edge in the second principal surface are connected to the connection portion.

15. The acoustic wave device according to claim 11, further comprising:
a mounting board; wherein
the package substrate is located above the mounting board, and the acoustic wave element is electrically connected to the mounting board via the package substrate.

16. The acoustic wave device according to claim 11, wherein
the acoustic wave element includes a piezoelectric substrate, at least one acoustic wave resonator on the piezoelectric substrate, a terminal electrically connected to the at least one acoustic wave resonator for external connection, and a bump joined to the terminal for external connection; and
the acoustic wave element is joined to the package substrate by the bump.

17. The acoustic wave device according to claim 11, wherein
the acoustic wave element includes a piezoelectric substrate, at least one acoustic wave resonator on the piezoelectric substrate, a terminal electrically connected to the at least one acoustic wave resonator for external connection, a support including a cavity surrounding the at least one acoustic wave resonator and provided on the piezoelectric substrate so as to cover at least a portion of the terminal for external connection, a cover on the support to close the cavity, a through-electrode extending through the cover and the support and connected to the terminal for external connection, and a bump joined to the through-electrode, and
the acoustic wave element is joined to the package substrate by the bump.

18. The acoustic wave device according to claim 11, wherein the acoustic wave element is one of a duplexer, a transmitting filter, a receiving filter, a multiplexer, or a one-port acoustic wave resonator.

19. The acoustic wave device according to claim 11, wherein the acoustic wave element includes a common connection terminal, a transmitting filter, and a receiving filter, and the transmitting filter and the receiving filter are commonly connected to the common connection terminal.

20. The acoustic wave device according to claim 19, wherein the common connection terminal is an antenna terminal.

\* \* \* \* \*